US012332829B2

(12) United States Patent
Yuan et al.

(10) Patent No.: US 12,332,829 B2
(45) Date of Patent: Jun. 17, 2025

(54) AUTOMATIC TEST EQUIPMENT ARCHITECTURE PROVIDING ODD SECTOR SIZE SUPPORT

(71) Applicant: ADVANTEST CORPORATION, Tokyo (JP)

(72) Inventors: Chi Yuan, San Jose, CA (US); Srdjan Malisic, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 27 days.

(21) Appl. No.: 18/128,872

(22) Filed: Mar. 30, 2023

(65) Prior Publication Data

US 2024/0176757 A1 May 30, 2024

Related U.S. Application Data

(60) Provisional application No. 63/439,861, filed on Jan. 19, 2023, provisional application No. 63/429,065, filed on Nov. 30, 2022.

(51) Int. Cl.
*G06F 13/42* (2006.01)

(52) U.S. Cl.
CPC ...... *G06F 13/4221* (2013.01); *G06F 13/4282* (2013.01); *G06F 2213/0026* (2013.01); *G06F 2213/0028* (2013.01)

(58) Field of Classification Search
CPC ............. G06F 13/4221; G06F 13/4282; G06F 2213/0026; G06F 2213/0028

(Continued)

(56) References Cited

U.S. PATENT DOCUMENTS 8,666,691 B2 3/2014 Ishikawa et al.
9,153,345 B2 * 10/2015 Lee .................. G11C 29/10

(Continued)

FOREIGN PATENT DOCUMENTS

KR 10-2000-0022022 A 4/2000
KR 10-2013-0084611 A 7/2013

(Continued)

OTHER PUBLICATIONS

Office Action received for Korean Application No. 10-2023-0169002 dated Feb. 28, 2025, 13 pages.

*Primary Examiner* — Christopher B Shin
(74) *Attorney, Agent, or Firm* — Squire Patton Boggs LLP; Sarah Mirza

(57) ABSTRACT

Automatic test equipment (ATE) configured to test devices under test (DUTs) can include a host device tester, one or more load boards, and one or more host bus adapters (HBAs). The host device tester does not support odd sector sizes and/or non-standard sector sizes. The one or more load boards can be communicatively coupled to the host device. The one or more HBAs can be communicatively coupled between respective load boards and one or more respective devices under test (DUTs). The one or more load boards can be configured to communicate with respective HBAs using one or more first communication protocol interfaces. The one or more HBAs can be configured to communicate with the respective DUTs using one or more second communication protocol interfaces. The HBAs can be configured to translate commands and data between the host device tester and the one or more DUTs that support odd sector size or non-standard sector size.

16 Claims, 3 Drawing Sheets

(58) Field of Classification Search
USPC .......................................................... 710/105
See application file for complete search history.

(56) References Cited

U.S. PATENT DOCUMENTS

| | | |
|---|---|---|
| 9,563,546 B2 | 2/2017 | Michelsen |
| 10,976,361 B2 * | 4/2021 | Malisic .................. G01R 1/025 |
| 11,009,550 B2 * | 5/2021 | Champoux ...... G01R 31/31907 |
| 11,430,536 B2 * | 8/2022 | Malisic .................. G11C 29/56 |
| 12,055,581 B2 * | 8/2024 | Champoux ............ G11C 29/10 |
| 12,079,098 B2 * | 9/2024 | Su ..................... G01R 31/31908 |
| 2015/0153405 A1 | 6/2015 | Wu et al. |
| 2019/0354453 A1 * | 11/2019 | Hsu .......................... G06F 11/24 |
| 2020/0088790 A1 * | 3/2020 | Balun ................. G06F 13/4282 |
| 2020/0200819 A1 * | 6/2020 | Malisic ............ G01R 31/31908 |
| 2020/0292609 A1 * | 9/2020 | Champoux ...... G01R 31/31907 |
| 2021/0117298 A1 * | 4/2021 | Su ..................... G01R 31/31724 |
| 2021/0125680 A1 * | 4/2021 | Malisic .................. G11C 29/14 |
| 2021/0278458 A1 * | 9/2021 | Su ........................... G06F 30/34 |
| 2021/0278462 A1 | 9/2021 | Su |

FOREIGN PATENT DOCUMENTS

| | | |
|---|---|---|
| KR | 10-2020-0139083 A | 12/2020 |
| TW | 202107283 A | 2/2021 |
| TW | 202139007 A | 10/2021 |
| TW | 202202865 A | 1/2022 |
| WO | 2011/149725 A2 | 12/2011 |

\* cited by examiner

AUTOMATIC TEST EQUIPMENT ARCHITECTURE PROVIDING ODD SECTOR SIZE SUPPORT

CROSS-REFERENCE TO RELATED APPLICATIONS

This application claims the benefit of U.S. Provisional Patent Application No. 63/429,065 filed Nov. 30, 2022 and U.S. Provisional Patent Application No. 63/439,861 filed Jan. 19, 2023, both of which are incorporated herein in their entirety.

BACKGROUND OF THE INVENTION

Automatic test equipment (ATE) are apparatuses that are utilized to perform tests on devices under test (DUTs) such as, but no limited to electronics systems and components. ATE can include a number of instruments capable of automatically testing, characterizing performance, diagnosing faults, and the like.

The ATE can include a host device tester (also referred to as a controller), one or more source and capture instruments, that are coupled to one or more DUTs by one or more load boards (also referred to as interface boards). The host device tester, which can be a computer, generally synchronizes the one or more source and capture instruments. At times, devices utilized to implement ATE do not support functions implemented in the DUT. Therefore, there is a continuing need for improved ATE devices and methods.

SUMMARY OF THE INVENTION

The present technology may best be understood by referring to the following description and accompanying drawings that are used to illustrate embodiments of the present technology directed toward odd sector size and/or non-standard sector size support for automated testing of devices.

In one embodiment, an automatic test equipment (ATE) apparatus can include a host device tester, one or more load boards, and one or more host bus adapters (HBAs). The one or more load boards can be communicatively coupled to the host device tester. The one or more HBAs can be coupled between respective load boards and DUTs. The load boards can be configured to communicate with respective HBAs using a first communication protocol interface. The HBAs can be configured to communicate with respective DUTs using a second communication protocol interface. The HBAs can be further configured to translate command and data between the first communication protocol interface and the second communication protocol interface to support the odd sector sizes and/or non-standard sector sizes of memory of the DUTs.

In another embodiment, a HBA is coupled to a load board between a host device tester and one or more DUTs. The one or more DUTs support one or more odd sector sizes and/or a non-standard sector sizes. However, the host device tester executes an operating system that does not support the one or more odd sector sizes and/or a non-standard sector sizes. The HBA can be configured to translate memory accesses to odd sector size memory accesses or non-standard sector size memory accesses.

In yet another embodiment, a method of accessing memory of one or more DUTs can include receiving, by a load board, a memory access from a host device tester on a first communication protocol interface. An operating system (OS) of the host device tester does not support an odd sector size or a non-standard sector size. The load board can pass the memory access from the host device tester to one or more HBAs. The HBA can translate the memory access to an odd sector size or non-standard sector size memory access. The HBA can then send the odd sector size or non-standard sector size memory access to one or more DUTs on a second communication protocol interface, wherein the one or more DUTs support the odd sector size or the non-standard sector size memory access.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Figure 1:
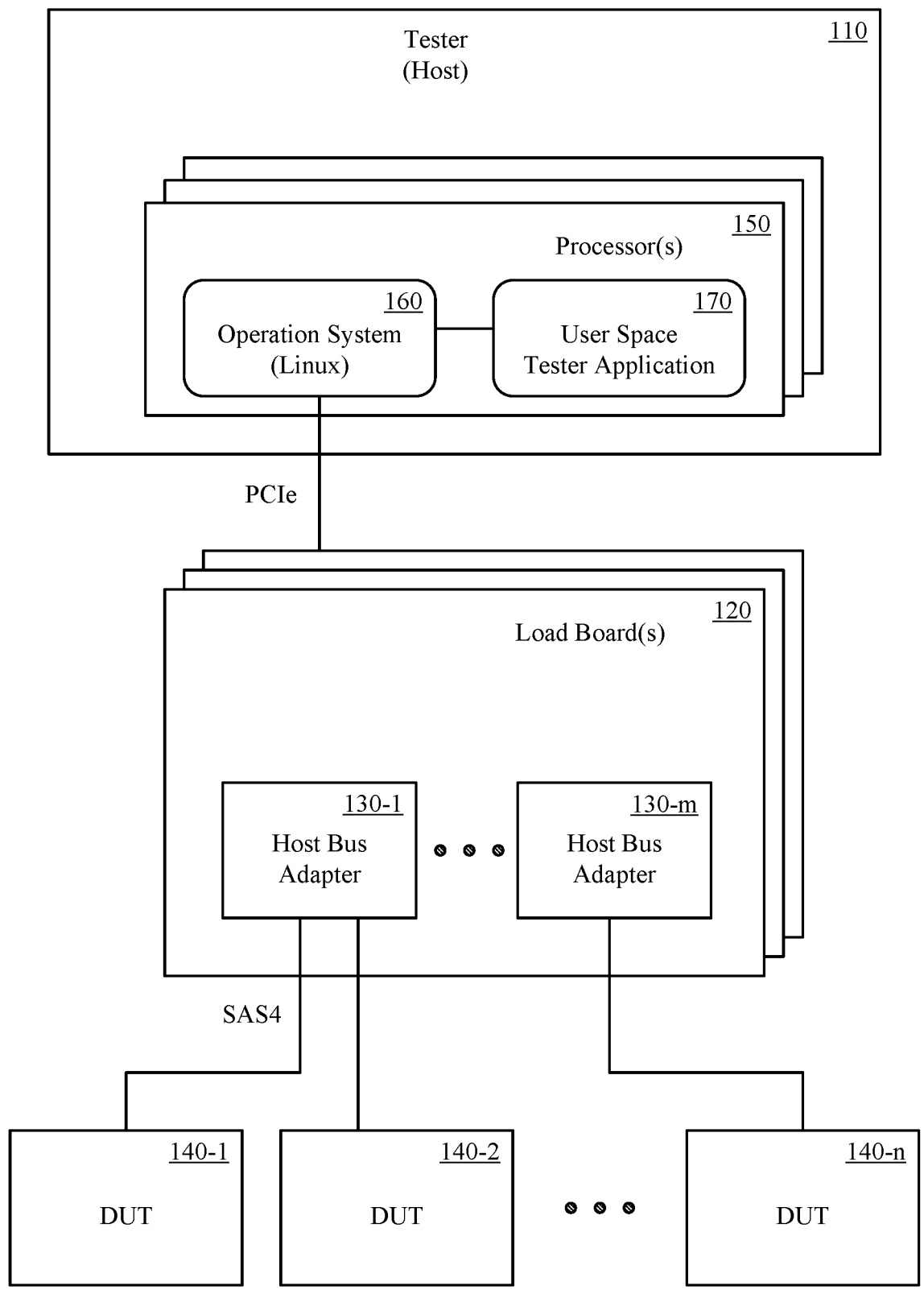
FIG. 1 shows an automatic test equipment (ATE) architecture providing odd or non-standard sector size access to memory of devices under test (DUTs), in accordance with aspects of the present technology.

Reference will now be made in detail to the embodiments of the present technology, examples of which are illustrated in the accompanying drawings. While the present technology will be described in conjunction with these embodiments, it will be understood that they are not intended to limit the technology to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. The use of the terms "comprises," "comprising," "includes," "including" and the like specify the presence of stated elements, but do not preclude the presence or addition of one or more other elements and or groups thereof. It is also to be understood that although the terms first, second, etc. may be used herein to describe various elements, such elements should not be limited by these terms. These terms are used herein to distinguish one element from another. For example, a first element could be termed a second element, and similarly a second element could be termed a first element, without departing from the scope of embodiments. It is also to be understood that when an element is referred to as being "coupled" to another element, it may be directly or indirectly connected to the other element, or an intervening element may be present. In contrast, when an element is referred to as being "directly connected" to another element, there are not intervening elements present. It is also to be understood that the term "and or" includes any and all combinations of one or more of the associated elements. It is also to be understood that the phraseology and terminology used herein is for the purpose of description and should not be regarded as limiting.

Aspects of the present technology provide for odd sector size and/or non-standard sector size support for memory testing in devices under test (DUTs) by automatic test equipment (ATE). In the ATE architecture, in accordance with aspects of the present technology, a host bus adapter (HBA) is located between a load board and a DUT. The DUT supports odd sector size and/or non-standard sector size access, while the host device of the tester does not support odd sector size or non-standard sector size access. As used herein odd sector size and/or non-standard sector size refers to sector sizes that are not a power of two. The HBA is adapted to perform translation between the communication interface of the host device of the tester and the communication interface of the DUT to support odd sector size and/or non-standard sector size access to media of the DUT.

Referring now to FIG. 1, an ATE architecture, in accordance with aspects of the present technology, is shown. The ATE architecture includes a tester 110 coupled to one or more load boards 120. Load boards 120 are also referred to as interface board that includes additional hardware (for example FPGAs and HBAs). The ATE architecture can also include one or more HBAs 130-1, 103-*m* coupled between one or more DUTs 140-1, 140-2, 140-*n* and the one or more load boards 120. The tester 110 can be implemented by a host device. The host device of the tester 110 does not support odd sector size or non-standard sector size memory access. In one implementation, the host device can be implemented by one or more computers running a Linux or Windows operation system (OS), or other computing device and operating system combination, that does not support odd sector size or non-standard sector size memory access. The one or more DUTs 140-1, 140-2, 140-*n* can support odd sector sizes. The DUTs 140-1, 140-2, 140-*n* can allocate one or more sectors for a user to access. The sectors of the storage media of the DUTs 140-1, 140-2, 140-*n* can be configured to include protection information or can be configured to be free of protection information.

The host device of the tester 110 can be communicatively coupled to the one or more load boards 120 by a first communication protocol interface, such as peripheral component interface express (PCIe). The one or more DUTs 140-1, 140-2, 140-*n* can be communicatively coupled to the one or more load boards 120 by a second communication protocol interface, such as serial attached small computer system interface (SAS). In one implementation, the second communication protocol interface communicatively coupling the one or more DUTs 140-1, 140-2, 140-*n* to the one or more load boards 120 can be one or more SAS4 interfaces.

In one implementation, a test application in a user space 170 generates memory accesses including one or more commands and optionally accompanying data. The operating system 160 of the host device of the tester 100, such as Linux and Window, does not support odd sector sizes or non-standard sector sizes, because it would not service memory buffer of exactly multiple of sector size. However, the user space tester application 170 can be configured to increase the size of memory buffer used in block device access based on an odd sector size or non-standard sector size configuration of the one or more DUTs 140-1, 140-2, 140-*n*. For odd sector size or non-standard sector size accesses, the operating system will use the memory buffer of increased size.

The one or more load boards 120 can provide one or more functions for the testing of the DUTs 140-1, 140-2, 140-*n*. The load boards 120 can for example provide for inputting test patterns to respective DUTs 140-1, 140-2, 140-*n*, comparator functions, and the like. The use of one or more load boards 120 reduces the load on the processor(s) 150 of the host device of the tester 110. For example, one or more processors 150 of the host device tester can transfer commands and test patterns to the one or more load boards 120. The one or more load boards 120 can apply the test patterns to respective DUTs 140-1, 140-2, 140-*n* in accordance with the commands. The one or more load boards 120 can also generate meta data, protection information or the like based on data access test patterns and respective commands. Instead, of returning all the data to the processors 150 of the host device of the tester 110, the one or more load boards 120 can return only data related to faults detected in response to the test patterns applied to the respective DUTs 140-1, 140-2, 140-*n*. In one implementation, the functions of the one or more load boards 120 can be implemented by one or more field programable gate arrays (FPGAs), application specific integrated circuits (ASICs), and/or the like. In one implementation, the one or more load boards 120 can be PCIe boards. In one implementation, the HBA 130-1, 130-*m* can be a commodity third-party HBA. As used herein, third-party refers to one or more manufacturing entities that differ from the manufacturing entity or entities of the tester 110 and/or load boards 120. The one or more DUTs 140-1, 140-2, 140-*n* can support odd sector sizes and/or non-standard sector sizes, such as sectors sizes of 512+8, 4096+8, 520+0, 528+0, 4104+0 and 4224+0 bytes per sector. In one implementation, the one or more DUTs 140-1, 140-2, 140-*n* can be, but are not limited to, solid state drives (SSDs) that support odd sector sizes and/or non-standard sector sizes for storing data and meta data, protection information (PI) or the like. In one implementation, odd sector sizes can be associate with protection information, and non-standard sector sizes are free of protection information. The DUTs 140-1, 140-2, 140-*n* can be operable to allocate an entire sector for a user space.

The one or more load boards 120 can be configured to generate repeatable test patterns sized to fit each of a plurality of odd sector sizes and/or non-standard sector sizes. For example, SSD DUTs 140-1, 140-2, 140-*n* may support several different odd sector sizes and/or non-standard sector sizes. The SSD DUTs 140-1, 140-2, 140-*n* may, for instance, support a standard sector size of 512+0 bytes, an odd sector size of 512+8 bytes, and a non-standard sector size of 528+0 bytes. The one or more load boards 120 can cycle through the various sector sizes and protection modes and test the SSD DUTs 140-1, 140-2, 140-*n* for each of the sector sizes. For example, the load board may first test the SSD using a 512 byte sector size. The load board may then re-format the SSDs for a 512+8 byte sector size, and test using data and generated protection information for the reformatted SSDs. Subsequently, the load board may again re-format the SSDs for 528+0 sector sizes. In this way, embodiments of the present technology can test the DUTs 140-1, 140-2, 140-*n* for all supported sector sizes. In other implementations, the one or more load boards 120 can be configured for select sector sizes and protection modes and test the SSD DUTs 140-1, 140-2, 140-*n* for the select sector sizes.

In one implementation, the host device of the tester 110 can communicate with the one or more load boards 120, and vice versa, using the PCIe communication protocol, and the one or more load boards 120 can communicate with the one or more HBAs 130-1, 130-*m*, and vice versa, using the PCIe communication protocol. The HBA 130-1, 130-*m* can communicate with the one or more DUTs 140-1, 140-2, 140-*n*, and vice versa, using the SAS communication protocol. The one or more DUTs 140-1, 140-2, 140-*n* can provide support for odd sector sizes and/or non-standard sector sizes, but the host device of the tester 110 does not provide support for odd sector sizes or non-standard sector sizes. Accordingly, the HBA 130-1, 130-*m* can provide the translation between the PCIe communication protocol and the SAS communication protocol, and vice versa. Therefore, the host device of the tester 110 does not need to be aware of the odd sector size or non-standard sector size. In particular the Linux operating system of the host device does not need to be aware of the odd sector size or non-standard sector size, or any support thereof. Instead, the Linux operating system of the host device of the tester 110 can communicate with the load board 120 using PCIe communication protocol.

In one implementation, the first and second communication protocol interfaces, along with the translation between the first and second communication protocol interfaces can be programed into the one or more HBAs 130-1, 130-*m*. Accordingly, the one or more HBAs 130-1, 130-*m* can be reconfigurable to support a number of different first and second communication protocol interfaces. In another implementation, the one or more HBAs 130-1, 130-*m* can implement a specific set of first and second communication protocol interfaces, along with the translation between the first and second communication protocol interfaces. If a different set of communication protocol interfaces, along with the translation between them is needed, the HBAs implementing first and second communication protocol interfaces and translation therebetween can be swapped out for different HBAs implementing the different set of communication protocol interfaces and translation therebetween.

The tester 110 can include additional modules, components, sub-systems and the like, but are not described herein because they are not needed for an understanding of aspects of the present technology. Similarly, the ATE architecture can also include additional modules, components, sub-systems and the like, but are not described herein because they are not needed for an understanding of aspects of the present technology.

Figure 2A:
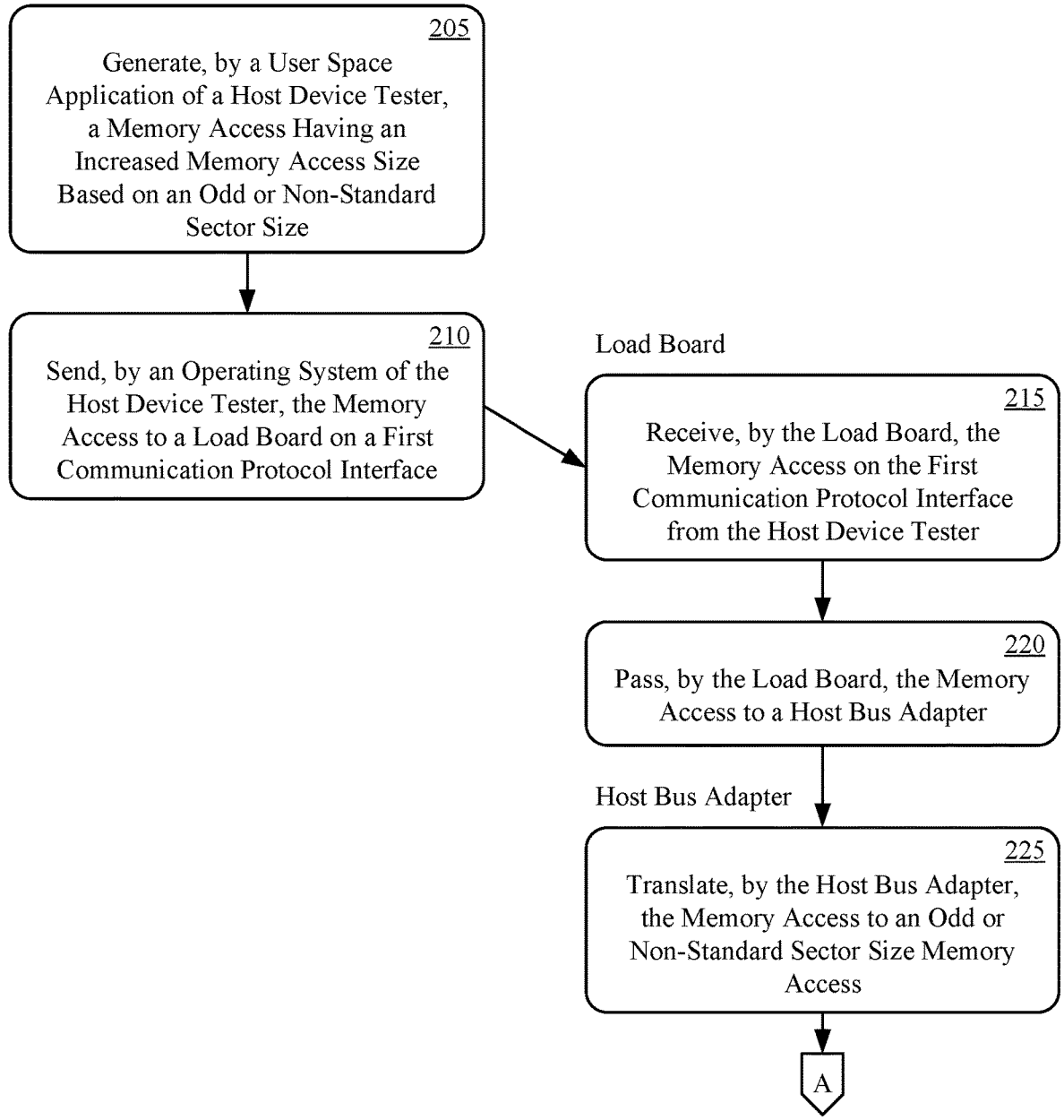
FIGS. 2A and 2B show a method supporting odd or non-standard sector size access to memory of DUTs, in accordance with aspects of the present technology.
Figure 2B:
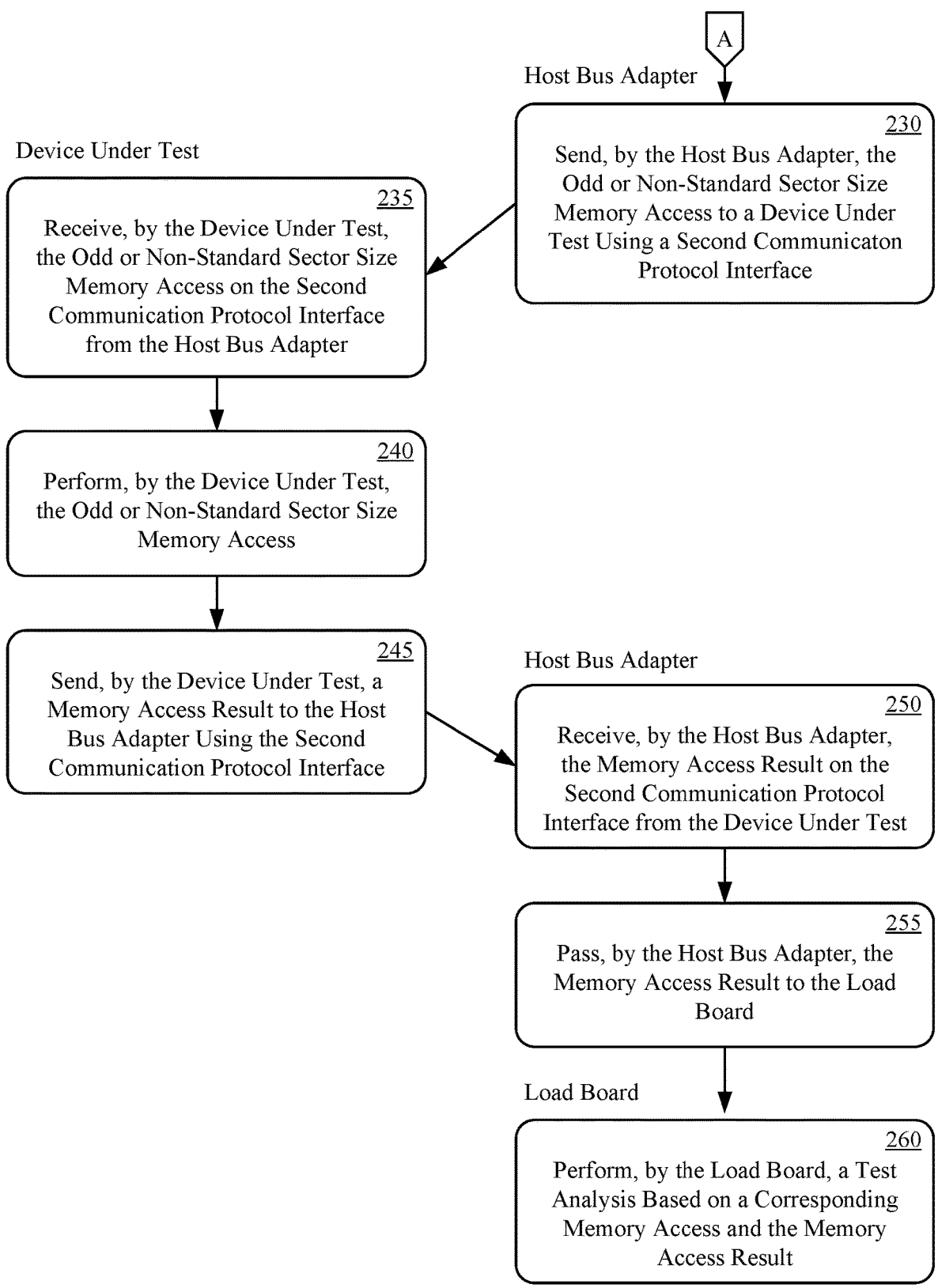

Referring now to FIGS. 2A and 2B, a method of accessing memory of DUTs, in accordance with aspects of the present technology, is shown. The method supports odd sector size or non-standard sector size accesses to memory of DUTs when an operating system of a host device tester does not support odd sector sizes and/or non-standard sector sizes. The method can include generation of a memory access having an increased memory size based on an odd sector size or non-standard sector size, at 205. In one implementation, an application, engine, module or the like, in a user space, for the host device tester can generate a memory access including one or more memory access commands with accompanying memory buffer for data. For example, the memory access can include a write command and data to write to memory in the one or more DUTs. When the DUTs support an odd sector size or non-standard sector size, a memory access size for the write command can be increased based on the odd sector size or non-standard sector size configuration of the DUTs. For instance, if the write command is to 100 sectors with accompanying 52000 bytes of memory, having a sector size of 520 bytes per sector (BPS), the memory buffer size can be increased to 52224 bytes, or 102 sectors of 512 byte.

At 210, the memory access can be sent by the operating system of the host device tester to one or more load boards on a first communication protocol interface. The operating system of the host device tester, such as Linux and Window, does not support odd sector sizes or non-standard sector sizes, and therefore would not service memory accesses commands to odd sector sizes and/or non-standard sector sizes. However, the operating system will instead send memory accesses that have the increased memory access size. In one implementation, the operating system can send the memory access to the load board using a PCIe protocol interface.

At 215, each of the one or more load boards can receive the memory access on the first communication protocol interface from the host device tester. At 220, the one or more load boards can pass the memory access to one or more HBAs coupled to the respective one or more load boards. At 225, the one or more HBAs can translate the memory access to an odd sector size or non-standard sector size memory access based on a configuration of the one or more DUTs coupled to the respective one or more HBAs. In one implementation, the one or more HBAs can translate a memory access received on a first communication protocol interface to an odd sector size or non-standard sector size memory access for transmission out on a second communication protocol interface. For instance, the one or more HBAs can translate a memory access received on a PCIe protocol interface to odd sector size or non-standard sector size memory access for transmission out on one or more SAS protocol interfaces. In one implementation, the HBAs can be a third-party commodity HBA. As used herein, a third-party HBA refers to a HBA that is manufactured by one or more entities that are different from the one or more entities that manufacture the host device tester and or the load board. At 230, the one or more HBAs can send the odd sector size or non-standard sector size memory access to respective DUTs using the second communication protocol interface.

At 235, the one or more DUTs can receive the odd sector size or non-standard sector size memory access from the respective HBAs. The odd sector size or non-standard sector size memory access can be received by the DUTs on respective second communication protocol interfaces from respect HBAs. At 240, the respective DUTs can perform the odd sector size or non-standard sector size memory access. For example, the DUTs can write data to the odd sector size or non-standard sector size configured memory. For instance, the DUTs can write the 100 sector of data, each sector 520 bytes.

The method can further include sending memory access results from the DUTs back to respective HBAs using the second communication protocol interfaces, at 245. For example, the memory access may also include a read command to read back the data written to the memory of the DUTs. In another example, the data write and read back can be handled in separate memory accesses. At 250, the memory access results can be received by respective HBAs on the second communication protocol interfaces from respective DUTs. At 255, the respective HBAs can pass the memory access results to respective load boards. At 260, the load boards can perform test analysis based on the memory access results and corresponding memory access. For example, the load boards can compare read back data in memory access results to the respective data from corresponding memory access writes to determine any read and/or write errors to the memory of the respective DUTs.

For DUTs, such as SSDs, where the memory buffer for device access can be configured for a plurality of different sector sizes, the process of 205-225 can be repeated to test the media of the DUTs for each of the configurable sector sizes.

Aspects of the present technology advantageously obviate the need to develop custom protocol or protocol handling for the load boards. The operating system of the host device tester advantageously does not need to be aware of the odd sector size or non-standard sector size, or provide any support thereof.

The foregoing descriptions of specific embodiments of the present technology have been presented for purposes of illustration and description. They are not intended to be exhaustive or to limit the present technology to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. An automatic test equipment (ATE) apparatus comprising:
   a host device tester, wherein an operating system of the host device tester does not support odd sector sizes or non-standard sector sizes; and
   a load board communicatively coupled to the host device tester, wherein the load board includes,
      a host bus adapter communicatively coupled between the load board and a device under test, wherein the load board is configured to communicate with the host bus adapter using a first communication protocol interface, the host bus adapter is configured to communicate with the device under test using a second communication protocol interface, and the host bus adapter is configured to translate commands and data between the first communication protocol interface and the second communication protocol interface; and
      a field programmable gate array configured to generate at a hardware level repeatable test patterns sized to fit an odd sector size or non-standard sector size of the device under test.

2. The ATE apparatus of claim 1, wherein:
   the first communication protocol comprise a peripheral component interconnect express (PCIe) protocol; and
   the second communication protocol comprises a serial attached small computer system interface (SAS) protocol.

3. The ATE apparatus of claim 1, wherein the device under test is operable to store data using a sector size selected from a group consisting of 520 bytes per sector (BPS), 528 BPS, 4104 BPS and 4224 BPS.

4. The ATE apparatus of claim 1, wherein the device under test is operable to allocate an entire sector for a user space applications.

5. The ATE apparatus of claim 4, wherein an entire sector of the odd sector size or non-standard sector size of the device under test having is free of protection information.

6. An automatic test equipment (ATE) apparatus comprising:
   a host bus adapter coupled to a load board between a host device tester and one or more devices under test; and
   one or more field programmable gate arrays (FPGAs) coupled to the load board;
      wherein the one or more devices under test support an odd sector size or non-standard sector size;
      wherein the host device tester executes an operating system that does not support the odd sector size or non-standard sector size; and
      wherein the host bus adapter is configured to translate memory accesses received from the host device tester using a first communication protocol interface to memory accesses using a second communication protocol interface to send to the one or more devices under test; and
      wherein the one or more field programmable gate arrays (FPGAs) is configured to generate at a hardware level repeatable test patterns sized to fit the odd sector size or non-standard sector size of the one or more devices under test.

7. The ATE apparatus of claim 6, wherein:
   the first communication protocol interface comprises a peripheral component interconnect express (PCIe) protocol interface; and
   the second communication protocol interface comprises a serial attached small computer system interface (SAS) protocol interface.

8. The ATE apparatus of claim 6, wherein the host bus adapter is further configured to:
  receive memory access results on the second communication protocol interface from the one or more devices under test; and
  pass the memory access results to the load board.

9. The ATE apparatus of claim 7, wherein the host bus adapter comprises a third-party host bus adapter.

10. A method of accessing memory of one or more devices under test comprising:
  receiving, by a load board, a memory access from a host device tester on a first communication protocol interface, wherein an operating system of the host device tester does not support an odd sector sizes or a non-standard sector sizes;
  passing, by the load board, the memory access from the host device tester to a host bus adapter and a field programmable gate array;
  translating, by the host bus adapter, the memory access of a first communication protocol to the memory access of a second communication protocol:
  generating, by the field programmable gate array at a hardware level, tester patterns of the memory access for an odd sector size or non-standard sector size of the one or more devices under test; and
  sending, by the host bus adapter, the odd sector size or non-standard sector size memory access including the tester patterns to the one or more devices under test on a second communication protocol interface, wherein the one or more devices under test support the odd sector size or the non-standard sector size memory access.

11. The method according to claim 10, further comprising:
  generating, by a user space application of the host device tester, the memory access having a memory buffer of increased size based on the odd sector size or the non-standard sector size; and
  sending, by the operating system of the host device tester, the memory access having the memory buffer of increased size to the load board on the first communication protocol interface.

12. The method according to claim 10, further comprising:
  receiving, by the one or more devices under test, the odd sector size or non-standard sector size memory access request on the second communication protocol interface from the host bus adapter; and
  performing, by the one or more devices under tests, the odd sector size or non-standard sector size memory access.

13. The method according to claim 12, further comprising:
  sending, by the one or more devices under test, a memory access result to the host bus adapter on the second communication protocol interface;
  receiving, by the host bus adapter, the memory access result, on the second communication protocol interface, from the one or more devices under test;
  passing, by the host bus adapter, the memory access result to the load board; and
  performing, by the load board, a test analysis based on a corresponding memory access and the memory access result.

14. The method according to claim 10, wherein the first communication protocol interface comprises a peripheral component interconnect express (PCIe) interface.

15. The method according to claim 10, wherein the second communication protocol interface comprises a serial attached small computer system interface (SAS) protocol interface.

16. The method according to claim 10, wherein the odd sector size or non-standard sector size comprises a sector size selected from a group consisting of 520 bytes per sector (BPS), 528 BPS, 4104 BPS and 4224 BPS.

* * * * *

UNITED STATES PATENT AND TRADEMARK OFFICE
CERTIFICATE OF CORRECTION

PATENT NO. : 12,332,829 B2
APPLICATION NO. : 18/128872
DATED : June 17, 2025
INVENTOR(S) : Chi Yuan et al.

Page 1 of 1

It is certified that error appears in the above-identified patent and that said Letters Patent is hereby corrected as shown below:

In the Claims

In Column 9, Line 21, in Claim 10, delete "protocol:" and insert -- protocol; --.

Signed and Sealed this
Second Day of September, 2025

Coke Morgan Stewart
*Acting Director of the United States Patent and Trademark Office*